United States Patent
Gryzlov et al.

(10) Patent No.: US 12,228,437 B2
(45) Date of Patent: Feb. 18, 2025

(54) MULTIPHASE FLOW METER

(71) Applicant: SAUDI ARABIAN OIL COMPANY, Dhahran (SA)

(72) Inventors: Anton Gryzlov, Moscow (RU); Sergey Safonov, Moscow (RU); Muhammad Arsalan, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 0 days.

(21) Appl. No.: 18/247,438

(22) PCT Filed: Sep. 1, 2022

(86) PCT No.: PCT/RU2022/000267
§ 371 (c)(1),
(2) Date: Mar. 30, 2023

(87) PCT Pub. No.: WO2024/049319
PCT Pub. Date: Mar. 7, 2024

(65) Prior Publication Data
US 2024/0361166 A1 Oct. 31, 2024

(51) Int. Cl.
*G01F 1/716* (2006.01)
*G01F 1/74* (2006.01)
*G01R 33/44* (2006.01)

(52) U.S. Cl.
CPC .............. *G01F 1/716* (2013.01); *G01F 1/74* (2013.01); *G01R 33/448* (2013.01)

(58) Field of Classification Search
CPC .............. G01F 1/716; G01F 1/58; G01F 1/74; G01R 33/563; G01R 33/56308; G01R 33/448
See application file for complete search history.

(56) References Cited

U.S. PATENT DOCUMENTS

| | | | | |
|---|---|---|---|---|
| 4,531,093 A | * | 7/1985 | Rollwitz | G01R 33/60 324/306 |
| 4,629,987 A | * | 12/1986 | King | G01R 33/56308 324/306 |
| 5,367,911 A | | 11/1994 | Jewell et al. | |

(Continued)

FOREIGN PATENT DOCUMENTS

| CN | 109115821 B | 9/2021 |
|---|---|---|
| EP | 1 173 734 A1 | 1/2002 |

(Continued)

OTHER PUBLICATIONS

International Search Report and Written Opinion of the International Searching Authority issued in corresponding International Application No. PCT/RU 2022/000267, mailed May 18, 2023 (7 pages).

(Continued)

*Primary Examiner* — Steven L Yeninas
(74) *Attorney, Agent, or Firm* — Osha Bergman Watanabe & Burton LLP

(57) ABSTRACT

A system includes a pipe, a multiphase fluid, and a measurement unit. The multiphase fluid is disposed within the pipe. The measurement unit is connected to the pipe and includes a cylindrical structure, a first magnet, a second magnet, a first coil, and a second coil. The cylindrical structure is submersed in the multiphase fluid and has a first end and a second end. The first magnet is connected to the first end of the cylindrical structure, and the second magnet is connected to the second end of the cylindrical structure. The first coil is wound around the outer circumferential surface of the pipe in a location corresponding to a location of the first magnet disposed within the orifice. The second coil is wound around the outer circumferential surface of the pipe in a location corresponding to a location of the second magnet disposed within the orifice.

20 Claims, 6 Drawing Sheets

(56) References Cited

U.S. PATENT DOCUMENTS

| | | | |
|---|---|---|---|
| 5,576,500 | A | 11/1996 | Cage et al. |
| 5,684,399 | A * | 11/1997 | Bayer ................... G01F 1/716 |
| | | | 324/306 |
| 6,046,587 | A * | 4/2000 | King ........................ G01V 3/14 |
| | | | 324/309 |
| 6,655,221 | B1 * | 12/2003 | Aspelund .................. G01F 1/74 |
| | | | 73/861.04 |
| 6,915,707 | B2 | 7/2005 | Nyfors et al. |
| 7,293,471 | B2 | 11/2007 | Lund Bo et al. |
| 10,024,806 | B2 | 7/2018 | Desmulliez et al. |
| 10,151,817 | B2 * | 12/2018 | Hogendoorn .......... G01N 33/28 |
| 2004/0015332 | A1 * | 1/2004 | Martin ................... G01R 33/44 |
| | | | 702/189 |
| 2005/0140368 | A1 * | 6/2005 | Freedman ............... E21B 49/08 |
| | | | 324/306 |
| 2018/0372523 | A1 * | 12/2018 | Alkhabbaz ................ G01F 1/24 |

FOREIGN PATENT DOCUMENTS

| | | |
|---|---|---|
| EP | 2687825 A3 | 6/2015 |
| RU | 2 261 435 C1 | 9/2005 |
| WO | 2017/007763 A1 | 1/2017 |

OTHER PUBLICATIONS

E. G. Nyfors, "Cylindrical Microwave Resonator Sensors for Measuring Materials Under Flow" Dissertation, Report S243, May 2000 (181 pages).

M. Meribout et al., "An ultrasonic based multi-phase flow composition meter", Journal Pre-proofs, Apr. 26, 2020, (59 pages).

R. Thorn et al., "Three-phase flow measurement in the petroleum industry" Measurement Science and Technology, vol. 24, 2013, 012003 (19 pages).

* cited by examiner

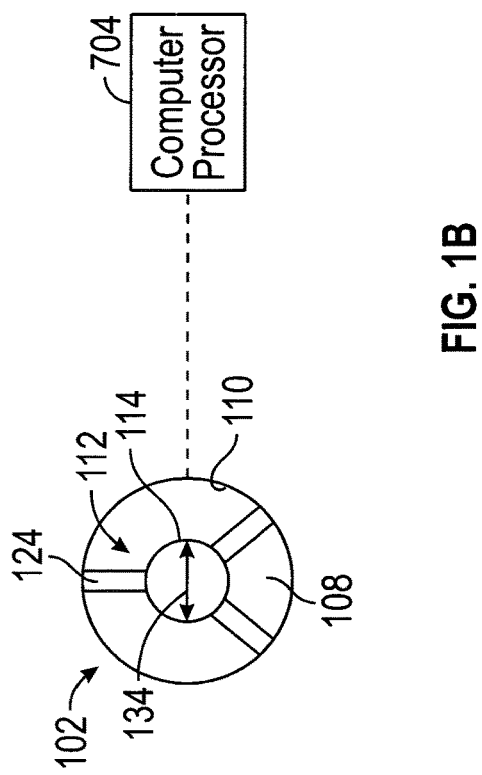
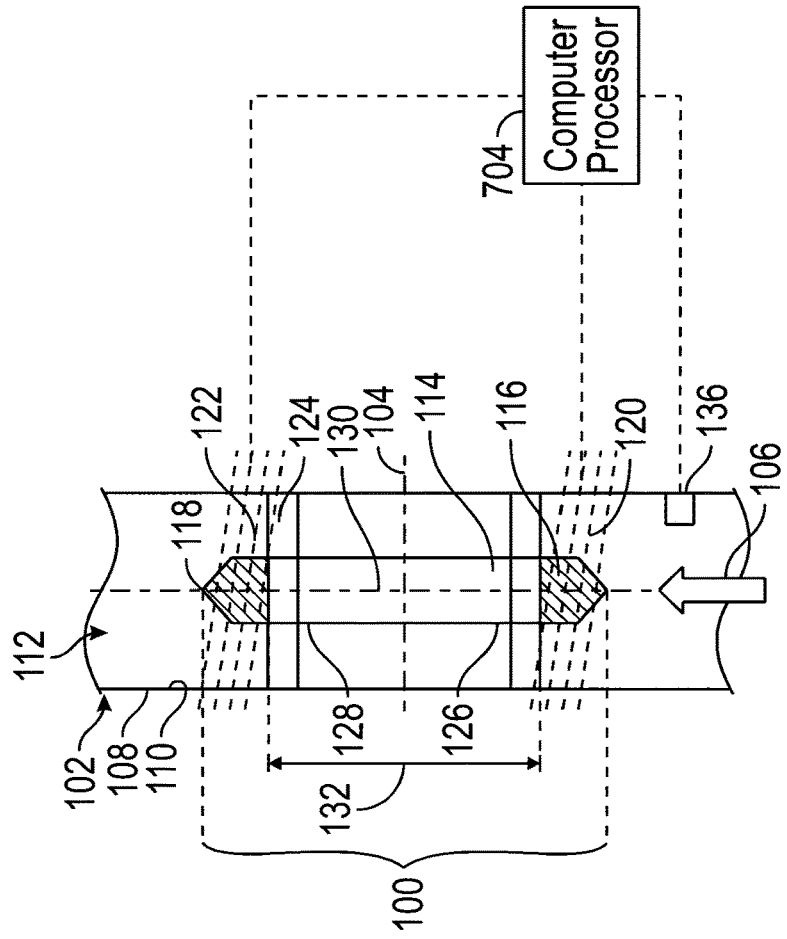
FIG. 1B
FIG. 1A

MULTIPHASE FLOW METER

BACKGROUND

Hydrocarbon transport systems are used to transport fluids to and from various production and refining operations. Hydrocarbon transport systems use conduits such as pipelines to transport the fluids over long distances. Herein, the term "fluid" is used to describe a substance that has no fixed shape and yields easily to external pressure, and, as such, the term "fluid" may be referring to gases, liquids, or a combination of both. The fluids that are transferred within the hydrocarbon transport systems may be crude oil, dry gas, wet gas, etc. Multiphase fluid is a term used for a fluid that is made of more than one phase (i.e., made up of both liquids and gases).

In multiphase fluid production, it is important to meter, or measure, the amounts and flow rates of each fluid (gas or liquid) present in the hydrocarbon transport system. It is difficult to measure the ratio of liquid to gas in multiphase fluids due to the inherent differences between these two fluids. Currently, there exist a few techniques used in multiphase metering such as using test separators, fluid sampling, tracer methods, etc. However, these techniques often cause pressure loss or are inaccurate, therefore, it is beneficial to develop techniques for multiphase fluid metering that is accurate and does not interfere significantly with the fluid or the fluid pressures.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

This disclosure presents, in accordance with one or more embodiments, methods and systems for measuring flow rates and volumetric fractions of a multiphase fluid. The system includes a pipe, a multiphase fluid, and a measurement unit. The pipe has an outer circumferential surface and an inner circumferential surface. The inner circumferential surface defines an orifice. The multiphase fluid is disposed within the orifice of the pipe. The measurement unit is connected to the pipe and includes a cylindrical structure, a first magnet, a second magnet, a first coil, and a second coil. The cylindrical structure is disposed within the orifice of the pipe, submersed in the multiphase fluid, and has a first end and a second end. The first end is opposite the second end along an axis. The first magnet is connected to the first end of the cylindrical structure, and the second magnet is connected to the second end of the cylindrical structure. The first coil is wound around the outer circumferential surface of the pipe in a location corresponding to a location of the first magnet disposed within the orifice. The second coil is wound around the outer circumferential surface of the pipe in a location corresponding to a location of the second magnet disposed within the orifice.

The method includes installing a measurement unit on a pipe transporting the multiphase fluid. The measurement unit includes a cylindrical structure submersed in the multiphase fluid, a first magnet and a second magnet connected to opposite ends of the cylindrical structure, and a first coil and a second coil wound around an outer circumferential surface of the pipe in locations corresponding to the first magnet and the second magnet, respectively. The method further includes obtaining resonant frequency measurements using the cylindrical structure and a computer processor, obtaining nuclear magnetic resonance measurements using the first magnet, the second magnet, the first coil, the second coil, and the computer processor, and measuring the flow rates and the volumetric fractions of the multiphase fluid using the resonant frequency measurements, the nuclear magnetic resonance measurements, and the computer processor.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn are not necessarily intended to convey any information regarding the actual shape of the particular elements and have been solely selected for case of recognition in the drawing.

FIGS. 1a and 1b show different cross sections of a multiphase flow meter in accordance with one or more embodiments.

DETAILED DESCRIPTION

Figure 2:
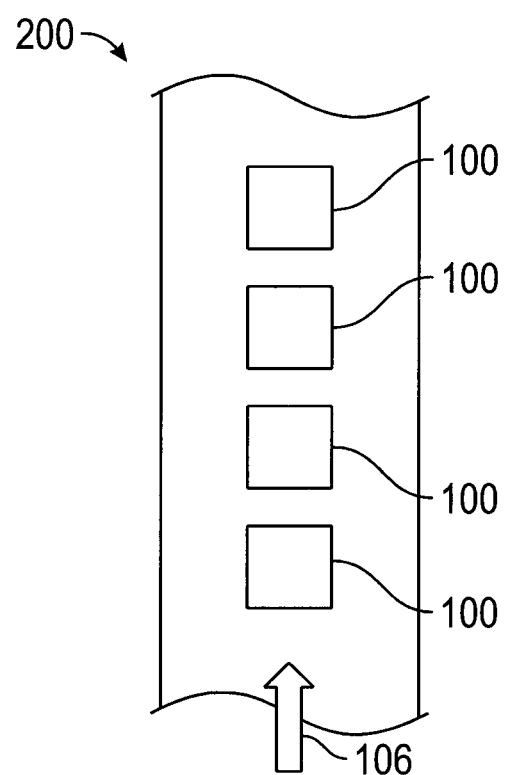
FIG. 2 shows a plurality of measurement units installed on a pipeline in accordance with one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

FIGS. 1a and 1b show different cross sections of a multiphase flow meter, herein called a measurement unit (100), in accordance with one or more embodiments. Specifically, FIGS. 1a and 1b show a single measurement unit (100) connected to a pipe (102), and FIG. 1b shows a cross section of FIG. 1a along a first axis (104).

The pipe (102) may be part of a pipeline that is transporting a multiphase fluid (106). In accordance with one or more embodiments, the pipe (102) is made out of a non-metallic material. The pipe (102) has an outer circumferential surface (108) and an inner circumferential surface (110). The inner circumferential surface (110) defines an orifice (112). In accordance with one or more embodiments, the multiphase fluid (106) is disposed within the orifice (112) of the pipe (102). In further embodiments, the multiphase fluid (106) is flowing within the pipe (102).

The measurement unit (100) is primarily made of a cylindrical structure (114), a first magnet (116), a second magnet (118), a first coil (120), and a second coil (122). The cylindrical structure (114) is disposed within the orifice (112) of the pipe (102) and is submersed in the multiphase fluid (106). The cylindrical structure (114) is centered within the orifice (112) by at least one support (124) that attaches the cylindrical structure (114) to the inner circumferential surface (110) of the pipe (102).

In accordance with one or more embodiments, the support (124) is made out of a dielectric material and is designed to allow the multiphase fluid (106) to flow through the support (124) and around the cylindrical structure (114). FIG. 1a shows two supports (124) connecting the cylindrical structure (114) to the inner circumferential surface (110) of the pipe (102): however, any number of supports (124) and any design of the supports (124) may be used without departing from the scope of the disclosure herein. In further embodiments, the cylindrical structure (114) only touches the inner circumferential surface (110) using the support(s) (124).

The cylindrical structure (114) has a first end (126) and a second end (128). The first end (126) is opposite the second end (128) along a second axis (130). The second axis (130) runs through the center of the cylindrical structure (114) and the pipe (102). The first axis (104) intersects the second axis (130). In accordance with one or more embodiments, the cylindrical structure (114) is closed, or largely closed, at the first end (126) and the second end (128). The cylindrical structure (114) may be hollow or filled with a dielectric material. The cylindrical structure (114) may act as a microwave cavity allowing microwaves to bounce back and forth within the cylindrical structure (114). At the cylindrical structure's (114) resonant frequency, the microwaves reinforce to form standing waves within the cylindrical structure (114).

In further embodiments, the length (132) of the cylindrical structure (114) is at least double the diameter (134) of the cylindrical structure (114) to ensure that the resonant frequency is lower than the cut-off frequency of the pipe (102). The microwaves are induced within the cylindrical structure (114) by providing an external excitation circuit. In accordance with one or more embodiments, the external excitation circuit for Nuclear Magnetic Resonance (NMR) sensing is created by the first magnet (116) and the second magnet (118).

The first magnet (116) is connected to the first end (126) of the cylindrical structure (114). The second magnet (118) is connected to the second end (128) of the cylindrical structure (114). The first magnet (116) and the second magnet (118) are connected to the cylindrical structure (114) by any means known in the art such as welding, adhesive, etc. In accordance with one or more embodiments, the first magnet (116) and the second magnet (118) are shaped in such a way that they ensure smooth transition of the fullbore volume of the multiphase fluid (106) into the reduced measurement volume created by the cylindrical structure (114) and support(s) (124). As such, the average velocity of the multiphase fluid (106) flow is increased which is accompanied by the increase in turbulence and the mixing of the multiphase fluid (106). This reduces the difference in velocities between all the phases of the multiphase fluid (106).

As shown in FIG. 1a, the first coil (120) is wound around the outer circumferential surface (108) of the pipe (102). The first coil (120) is wound in a location corresponding to a location of the first magnet (116) disposed within the orifice (112). The second coil (122) is wound around the outer circumferential surface (108) of the pipe (102). The second coil (122) is wound in a location corresponding to a location of the second magnet (118) disposed within the orifice (112). In accordance with one or more embodiments, the first coil (120) and the second coil (122) are radio frequency coils capable of creating radio frequency magnetic fields that are perpendicular to the magnetic field created by the first magnet (116) and the second magnet (118).

In further embodiments, a sensor (136), such as a pressure sensor and/or a temperature sensor, is located in the pipe (102) as part of the measurement unit (100). Specifically, the sensor (136) may be embedded into the flow of the multiphase fluid (106) and may be connected to the inner circumferential surface (110) of the pipe (102). Further, the sensor (136) may extend from the inner circumferential surface (110) to the outer circumferential surface (108) to be read manually (using a gauge or a digital screen) or to be connected, wirelessly or wired, to a computer processor (705) that may store, analyze, and visualize the data obtained by the sensor (136).

The computer processor (705) may be part of a computer (702) system as described in FIG. 7 below. The computer processor (705) may also be connected, wirelessly or wired, to the first coil (120) and the second coil (122) in order to obtain resonant frequency measurements and NMR measurements created using the cylindrical structure (114), first magnet (116), second magnet (118), first coil (120), and second coil (122).

Specifically, for the NMR measurements, the measurement unit (100) provides to the computer processor (705) NMR magnetization, T1 and T2 as a function of time for different NMR sensors (at least) along the cylindrical body. Within the measurement unit (100) these values will be originated and internally processed from the raw data acquired from the first coil (120) and the second coil (122) using two different pulse sequence techniques outlined below. For the resonant frequency measurements, the microwaves creating the resonant frequency and a quality factor are obtained from the measurement unit (100).

FIG. 2 shows a plurality of measurement units (100) installed on a pipeline (200) in accordance with one or more embodiments. The pipeline (200) may be made out of a plurality of pipes (102) connected together. The pipes (102) may be connected together to form the pipeline (200) using any method known in the art such as threading the pipes (102) together using threaded ends. In other embodiments, the pipeline (200) may be made out of a singular pipe (102) having a plurality of measurement units (100). Further, FIG. 2 shows four measurement units (100) installed on the pipeline (200); however, any number of measurement units (100) may be installed on the pipeline (200) without departing from the scope of the disclosure herein.

The pipes (102) and the measurement units (100) may be similar to or the same as the pipe (102) and the measurement unit (100) described in FIGS. 1a and 1b. Similar elements have not been redescribed for purposes of readability and have the same description and function as outlined above. In accordance with one or more embodiments, each measurement unit (100) may have their own temperature/pressure sensor (136), or there may be a single temperature/pressure sensor (136) for the whole pipeline (200) without departing from the scope of the disclosure herein.

Figure 3:
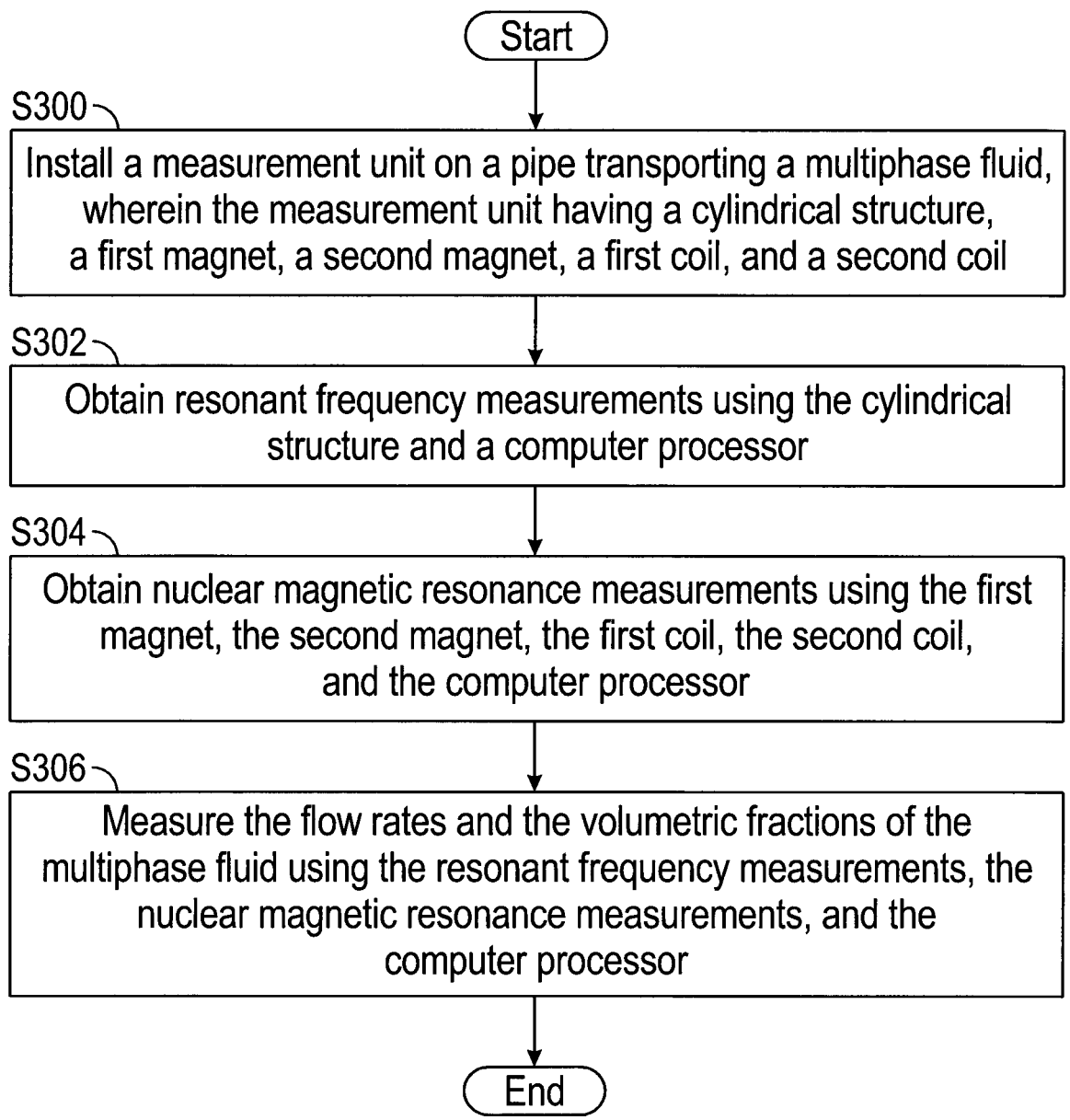
FIG. 3 shows a flowchart in accordance with one or more embodiments.

FIG. 3 shows a flowchart in accordance with one or more embodiments. The flowchart outlines a method for measuring flow rates and volumetric fractions of a multiphase fluid (106) flowing through a pipe (102) using one or more measurement units (100). While the various blocks in FIG. 3 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

Initially, the measurement unit (100) is installed on the pipe (102) transporting the multiphase fluid (106), wherein the measurement unit (100) has a cylindrical structure (114), a first magnet (116), a second magnet (118), a first coil (120), and a second coil (122) (S300). In accordance with one or more embodiments, the cylindrical structure (114) is submersed in the multiphase fluid (106), the first magnet (116) and the second magnet (118) are connected to opposite ends of the cylindrical structure (114), and the first coil (120) and the second coil (122) are wound around an outer circumferential surface (108) of the pipe (102) in locations corresponding to the first magnet (116) and the second magnet (118), respectively.

Resonant frequency measurements are obtained using the cylindrical structure (114) and a computer processor (705) (S302). Specifically, an external excitation circuit, such as the first magnet (116) and the second magnet (118), is provided around the cylindrical structure (114) to generate a magnetic field within the cylindrical structure (114). The cylindrical structure (114) acts as a microwave cavity allowing the microwaves created by the external excitation circuit to bounce back and forth within the cylindrical structure (114). At the cylindrical structure's (114) resonant frequency, the microwaves reinforce to form standing waves within the cylindrical structure (114).

In further embodiments, the length (132) of the cylindrical structure (114) is at least double the diameter (134) of the cylindrical structure (114) to ensure that the resonant frequency is lower than the cut-off frequency of the pipe (102). The resonant frequency of the cylindrical structure (114) depends on the dielectric permittivity of the multiphase fluid (106) which fills the volume between the cylindrical structure (114) and the inner circumferential surface (110) of the pipe (102).

The relationship between resonant frequency and dielectric permittivity of the multiphase fluid (106) is given by Equation (1) below where $f_0$ is the reference resonant frequency (i.e., the resonant frequency when there is only atmospheric air between the cylindrical structure (114) and the inner circumferential surface (110) of the pipe (102)), $f_{mix}$ is the resonant frequency of the multiphase fluid (106), and $\varepsilon_m$ is the dielectric permittivity of the multiphase fluid (106).

$$\varepsilon_m = \left(\frac{f_0}{f_{mix}}\right)^2 \qquad \text{Equation (1)}$$

The relationship between the dielectric permittivity of the multiphase fluid (106) and the volumetric fractions of the multiphase fluid (106) is defined by Equation (2) below where $\varepsilon_g$ is the dielectric permittivity of gas, $\varepsilon_{liq}$ is the dielectric permittivity of liquid, and $\alpha_l$ is the volumetric fraction of the liquid portion of the multiphase fluid (106). In a petroleum production scenario, the permittivity of the liquid depends on the permittivity of the mixture of oil and water.

$$\alpha_l = \frac{\varepsilon_g - \varepsilon_m}{\varepsilon_g - \varepsilon_{liq}} \left(\frac{\varepsilon_{liq}}{\varepsilon_m}\right)^{1/3}. \qquad \text{Equation (2)}$$

In view of the above, the computer processor (705) retrieves the resonant frequency value(s) of the multiphase fluid (106) ($f_0$) created by the application of the external excitation circuit to the cylindrical structure (114). The computer processor (705) determines the dielectric permittivity of the multiphase fluid (106) ($\varepsilon_m$) using Equation (1) above and known value $f_0$. Once the dielectric permittivity of the multiphase fluid (106) ($\varepsilon_m$) is determined by the computer processor (705), the volumetric fraction of the liquid portion of the multiphase fluid (106) ($\alpha_l$) may be determined using Equation (2) above and known values $\varepsilon_g$ and $\varepsilon_{liq}$.

Figure 4:
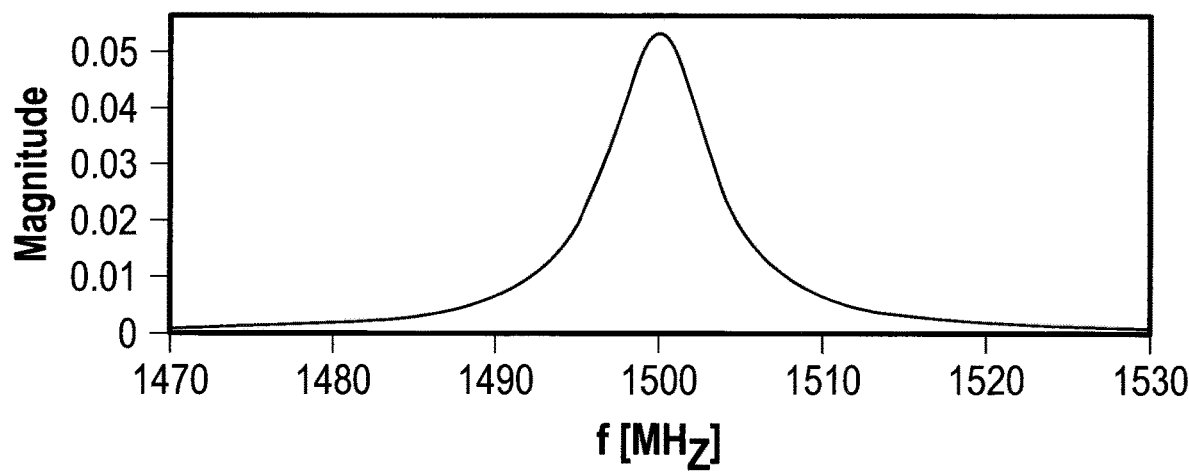
FIG. 4 shows example resonant frequency values that may be obtained from applying the external excitation circuit to the cylindrical structure in accordance with one or more embodiments.

FIG. 4 shows example resonant frequency values that may be obtained from applying the external excitation circuit to the cylindrical structure (114) in accordance with one or more embodiments. In FIG. 4, the resonant frequency values are located along the x-axis and the magnitude of each resonant frequency value are shown on the y-axis. The resonant frequency value that would be pulled from FIG. 4 to be used in Equation (1) would be the resonant frequency value having the highest magnitude.

NMR measurements are obtained using the first magnet (116), the second magnet (118), the first coil (120), the second coil (122), and the computer processor (705) (S304). The flow rates and the volumetric fractions of the multiphase fluid (106) are measured using the resonant frequency measurements, the NMR measurements, and the computer processor (705) (S306).

In accordance with one or more embodiments, the first coil (120) and the second coil (122) are radio frequency (RF) coils. The first magnet (116) and the second magnet (118) create a fixed magnetic field ($B_0$). The first coil (120) and the second coil (122) produce a rapidly varying magnetic field ($B_1$). The $B_1$ field rapidly changes internal precession dynamics of hydrogen nuclei precession, which is sensitive to the different type of the flowing phases at the vicinity of the first coil (120) and the second coil (122).

The first coil (120) is used to detect a signal from the flowing multiphase fluid (106) spins inside the pipe (102). Specifically, the measurement unit (100) is connected to the computer processor (705). The computer processor (705) applies a first signal to the first coil (120) and reads a second signal excited in the second coil (122). For the first signal, the measurement unit (100) sets the amplitude, width and shape. A Carr-Purcell-Meiboom-Gill (CPMG) pulse sequence may be applied in both the first coil (120) and the second coil (122) and the longitudinal relaxation time (T1) in free induction decay (FID) experiment or transverse (T2) relaxation times may be measured.

Specifically, the first magnet (116) and the first coil (120) 'codes' the multiphase. fluid (106) flow using spin magnetization according to the FID or CPMG pulse sequence. The second magnet (118) and the second coil (122) detects the corresponding spin longitudinal relaxation after the multiphase fluid (106). The longitudinal relaxation is due to energy exchange between the spins and surroundings (spin-lattice relaxation). As spins go from a high energy state back to a low energy state, the RF energy is released back into the surrounding lattice. The recovery of longitudinal magnetization follows an exponential curve and characterized by material time constant T1.

Transverse relaxation results from spins getting out of phase. As spins move together, their magnetic fields interact (spin-spin interaction), slightly modifying their precession rate. These interactions are temporary and random. Thus, spin-spin relaxation causes a cumulative loss in phase resulting in transverse magnetization decay. Transverse magnetization decay is described by an exponential curve, characterized by the time constant T2.

Figure 5:
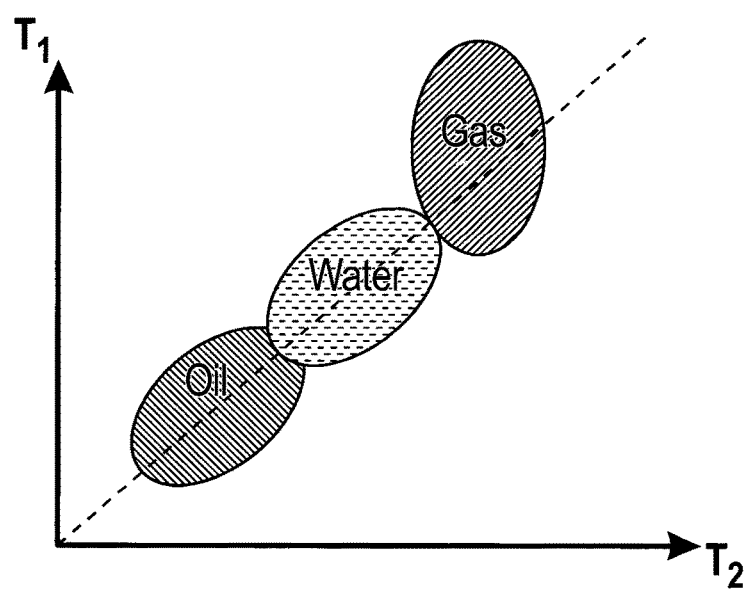
FIG. 5 shows a map of reconstructed T1 and T2 distributions that show the volumetric fractions of oil, water, and gas present in the multiphase fluid in accordance with one or more embodiments.

By using NMR FID and CPMG pulse sequence technique, T1 and T2 times can be detected. By plotting a 2D map of reconstructed T1 and T2 distribution the volumetric fractions between oil, water and gas present in the multiphase fluid (106) may be determined. This procedure also relies on the calibration mean values for oil, water and gas in a 2D T1-T2 map. FIG. 5 shows a map of reconstructed T1 and T2 distributions that show the volumetric fractions of oil, water, and gas present in the multiphase fluid (106) in accordance with one or more embodiments. In FIG. 5, the T2 values are shown on the x-axis and the T1 values are shown on the y-axis.

Once two volumetric fractions are determined, the remaining fraction may be calculated using Equation (3) below where $\alpha_g$ is the volumetric fraction of gas, $\alpha_o$ is the volumetric fraction of oil, and $\alpha_w$ is the volumetric fraction of water. $\alpha_l$, determined above, is the summation of the volumetric fraction of oil and water.

$$1 = \alpha_g + \alpha_o + \alpha_w \qquad \text{Equation (3)}$$

To increase the quality of T1 and T2 measurements more than two pairs of magnets and RF coils may be installed on the pipe (102). In accordance with one or more embodiments, five pairs of magnets and coils: (first magnet (116), first coil (120)), (second magnet (118), second coil (122)), (third magnet (not pictured), third coil (600)), (fourth magnet (not pictured), fourth coil (602)), and (fifth magnet (not pictured), fifth coil (604)) are installed on the pipe (102).

Figure 6A:
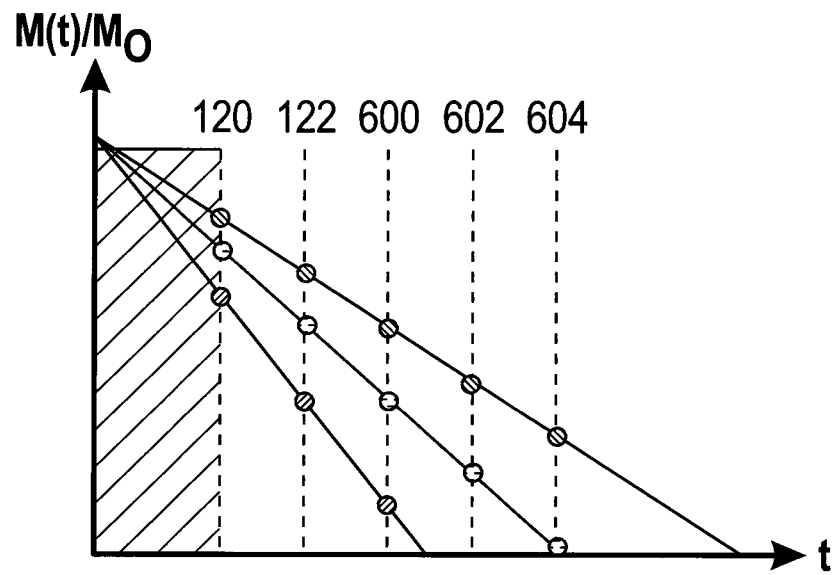
FIG. 6a shows the distribution of data obtained from the five pairs of magnets and coils as described above and in accordance with one or more embodiments.
Figure 6B:
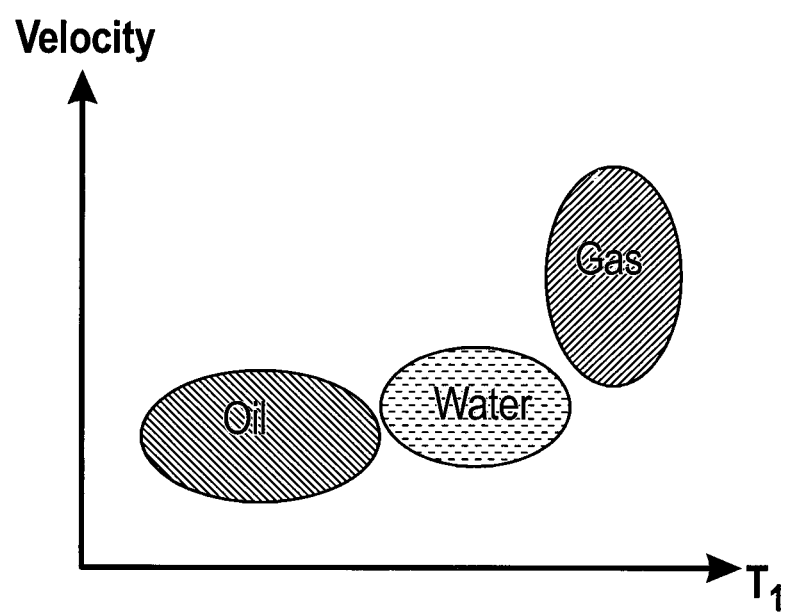
FIG. 6b shows the velocity for each phase at different T1 values in accordance with one or more embodiments.

FIG. 6a shows the distribution of data obtained from the five pairs of magnets and coils as described above and in accordance with one or more embodiments. Specifically, the time of the fluid flow along multiple magnets (i.e., the first magnet (116) and the second magnet (118)) are located along the x-axis and the NMR magnetization value as a ratio of the magnetization change in time (M(t)) over initial magnetization (M(0)) is located along the y-axis. By measuring the magnetization at different locations of the coils and the magnets, as shown in FIGS. 6a and 6b, the flow velocities may be determined for each fluid phase using the computer processor (705). FIG. 6b shows the velocity for each phase at different T1 values in accordance with one or more embodiments.

Once the velocities and the volumetric fractions are determined, the flow rate of each phase may be determined. In further embodiments, the flow rate, velocity, and the volumetric fractions may be adjusted using temperature and/or pressure data obtained by the pressure and/or temperature sensor(s) (136). In other embodiments, pressure and temperature measurements combined with a sample of the hydrocarbon composition may provide correction for fluid densities and viscosities and can be used to estimate the gas to oil ratio.

Figure 7:
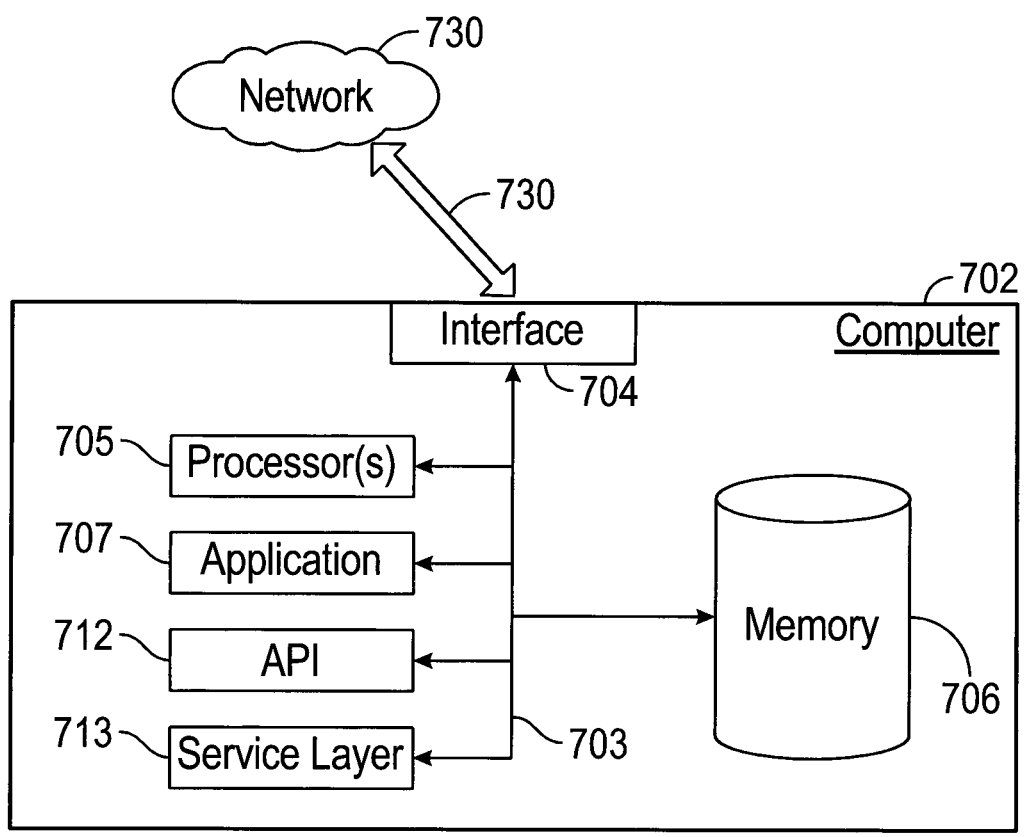
FIG. 7 shows a computer system in accordance with one or more embodiments.

FIG. 7 shows a computer (702) system in accordance with one or more embodiments. Specifically, FIG. 7 shows a block diagram of a computer (702) system used to provide computational functionalities associated with described algorithms, methods, functions, processes, flows, and procedures as described in the instant disclosure, according to an implementation. The illustrated computer (702) is intended to encompass any computing device such as a server, desktop computer, laptop/notebook computer, wireless data port, smart phone, personal data assistant (PDA), tablet computing device, one or more processors within these devices, or any other suitable processing device, including both physical or virtual instances (or both) of the computing device.

Additionally, the computer (702) may include a computer that includes an input device, such as a keypad, keyboard, touch screen, or other device that can accept user information, and an output device that conveys information associated with the operation of the computer (702), including digital data, visual, or audio information (or a combination of information), or a GUI.

The computer (702) can serve in a role as a client, network component, a server, a database or other persistency, or any other component (or a combination of roles) of a computer system for performing the subject matter described in the instant disclosure. The illustrated computer (702) is communicably coupled with a network (730). In some implementations, one or more components of the computer (702) may be configured to operate within environments, including cloud-computing-based, local, global, or other environment (or a combination of environments).

At a high level, the computer (702) is an electronic computing device operable to receive, transmit, process, store, or manage data and information associated with the described subject matter. According to some implementations, the computer (702) may also include or be communicably coupled with an application server, e-mail server, web server, caching server, streaming data server, business intelligence (BI) server, or other server (or a combination of servers).

The computer (702) can receive requests over network (730) from a client application (for example, executing on another computer (702)) and responding to the received requests by processing the said requests in an appropriate software application. In addition, requests may also be sent to the computer (702) from internal users (for example, from a command console or by other appropriate access method), external or third-parties, other automated applications, as well as any other appropriate entities, individuals, systems, or computers.

Each of the components of the computer (702) can communicate using a system bus (703). In some implementations, any or all of the components of the computer (702), both hardware or software (or a combination of hardware and software), may interface with each other or the interface (704) (or a combination of both) over the system bus (703) using an application programming interface (API) (712) or a service layer (713) (or a combination of the API (712) and service layer (713). The API (712) may include specifications for routines, data structures, and object classes. The API (712) may be either computer-language independent or dependent and refer to a complete interface, a single function, or even a set of APIs. The service layer (713) provides software services to the computer (702) or other components (whether or not illustrated) that are communicably coupled to the computer (702).

The functionality of the computer (702) may be accessible for all service consumers using this service layer. Software services, such as those provided by the service layer (713), provide reusable, defined business functionalities through a defined interface. For example, the interface may be software written in JAVA, C++, or other suitable language providing data in extensible markup language (XML) format or other suitable format. While illustrated as an integrated component of the computer (702), alternative implementations may illustrate the API (712) or the service layer (713) as stand-alone components in relation to other components of the computer (702) or other components (whether or not illustrated) that are communicably coupled to the computer (702). Moreover, any or all parts of the API (712) or the service layer (713) may be implemented as child or sub-modules of another software module, enterprise application, or hardware module without departing from the scope of this disclosure.

The computer (702) includes an interface (704). Although illustrated as a single interface (704) in FIG. 7, two or more interfaces (704) may be used according to particular needs, desires, or particular implementations of the computer (702). The interface (704) is used by the computer (702) for communicating with other systems in a distributed environment that are connected to the network (730). Generally, the interface (704) includes logic encoded in software or hardware (or a combination of software and hardware) and operable to communicate with the network (730). More specifically, the interface (704) may include software supporting one or more communication protocols associated with communications such that the network (730) or interface's hardware is operable to communicate physical signals within and outside of the illustrated computer (702).

The computer (702) includes at least one computer processor (705). Although illustrated as a single computer processor (705) in FIG. 7, two or more processors may be used according to particular needs, desires, or particular implementations of the computer (702). Generally, the computer processor (705) executes instructions and manipulates data to perform the operations of the computer (702) and any algorithms, methods, functions, processes, flows, and procedures as described in the instant disclosure.

The computer (702) also includes a non-transitory computer (702) readable medium, or a memory (706), that holds data for the computer (702) or other components (or a combination of both) that can be connected to the network (730). For example, memory (706) can be a database storing data consistent with this disclosure. Although illustrated as a single memory (706) in FIG. 7, two or more memories may be used according to particular needs, desires, or particular implementations of the computer (702) and the described functionality. While memory (706) is illustrated as an integral component of the computer (702), in alternative implementations, memory (706) can be external to the computer (702).

The application (707) is an algorithmic software engine providing functionality according to particular needs, desires, or particular implementations of the computer (702), particularly with respect to functionality described in this disclosure. For example, application (707) can serve as one or more components, modules, applications, etc. Further, although illustrated as a single application (707), the application (707) may be implemented as multiple applications (707) on the computer (702). In addition, although illustrated as integral to the computer (702), in alternative implementations, the application (707) can be external to the computer (702).

There may be any number of computers (702) associated with, or external to, a computer system containing computer (702), each computer (702) communicating over network (730). Further, the term "client," "user," and other appropriate terminology may be used interchangeably as appropriate without departing from the scope of this disclosure. Moreover, this disclosure contemplates that many users may use one computer (702), or that one user may use multiple computers (702).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed is:

1. A system comprising:
   a pipe having an outer circumferential surface and an inner circumferential surface, wherein the inner circumferential surface defines an orifice;
   a multiphase fluid disposed within the orifice of the pipe; and
   a measurement unit connected to the pipe, the measurement unit comprising:
     a cylindrical structure disposed within the orifice of the pipe, submersed in the multiphase fluid, and having a first end and a second end, wherein the first end is opposite the second end along an axis;
     a first magnet connected to the first end of the cylindrical structure;
     a second magnet connected to the second end of the cylindrical structure;
     a first coil wound around the outer circumferential surface of the pipe in a location corresponding to a location of the first magnet disposed within the orifice; and
     a second coil wound around the outer circumferential surface of the pipe in a location corresponding to a location of the second magnet disposed within the orifice.

2. The system of claim 1, wherein the measurement unit further comprises at least one support connecting the cylindrical structure to the inner circumferential surface of the pipe.

3. The system of claim 2, wherein the cylindrical structure only touches the inner circumferential surface using the at least one support.

4. The system of claim 3, wherein the at least one support is made of a dielectric material.

5. The system of claim 1, wherein the cylindrical structure is hollow or filled with a dielectric material.

6. The system of claim 1, further comprising a sensor connected to the inner circumferential surface of the pipe.

7. The system of claim 6, wherein the sensor further comprises one or more sensors selected from a list consisting of a pressure sensor and a temperature sensor.

8. The system of claim 1, wherein the measurement unit comprises a plurality of measurement units each installed at different locations along the pipe.

9. The system of claim 1, wherein the first coil and the second coil further comprises a radio frequency coil.

10. The system of claim 1, wherein the cylindrical structure comprises a length and a diameter and the length is at least double the diameter.

11. A method for measuring flow rates and volumetric fractions of a multiphase fluid, the method comprising:
   installing a measurement unit on a pipe transporting the multiphase fluid, wherein the measurement unit comprises:
      a cylindrical structure submersed in the multiphase fluid;
      a first magnet and a second magnet connected to opposite ends of the cylindrical structure;
      a first coil and a second coil wound around an outer circumferential surface of the pipe in locations corresponding to the first magnet and the second magnet, respectively;
   obtaining resonant frequency measurements using the cylindrical structure and a computer processor;
   obtaining nuclear magnetic resonance measurements using the first magnet, the second magnet, the first coil, the second coil, and the computer processor; and
   measuring the flow rates and the volumetric fractions of the multiphase fluid using the resonant frequency measurements, the nuclear magnetic resonance measurements, and the computer processor.

12. The method of claim 11, further comprising adjusting the flow rates and the volumetric fractions using data obtained from a sensor.

13. The method of claim 12, wherein the sensor further comprises one or more sensors selected from a list consisting of a pressure sensor and a temperature sensor.

14. The method of claim 11, wherein obtaining the resonant frequency measurements further comprises providing an external excitation circuit to generate a magnetic field within the cylindrical structure.

15. The method of claim 14, wherein the resonant frequency measurements depend on a dielectric permittivity of the multiphase fluid located between the cylindrical structure and the pipe.

16. The method of claim 11, wherein the first coil and the second coil each further comprise a radio frequency coil.

17. The method of claim 16, wherein the radio frequency coils wound around the outer circumferential surface of the pipe near the magnets form a rapidly varying magnetic field.

18. The method of claim 17, wherein obtaining the nuclear magnetic resonance measurements further comprises coding a flow of the multiphase fluid using spin magnetization caused by the first magnet and the first coil.

19. The method of claim 18, wherein obtaining the nuclear magnetic resonance measurements further comprises detecting corresponding spin relaxation processes using the second magnet and the second coil.

20. The method of claim 11, further comprising inducing mixing of the multiphase fluid by reducing a cross section of the pipe due to the first magnet and the second magnet.

* * * * *